US007539965B2

(12) United States Patent
Bromberger et al.

(10) Patent No.: US 7,539,965 B2
(45) Date of Patent: May 26, 2009

(54) CIRCUIT LAYOUT WITH ACTIVE COMPONENTS AND HIGH BREAKDOWN VOLTAGE

(75) Inventors: Christoph Bromberger, Heilbronn (DE); Volker Dudek, Brackenheim (DE)

(73) Assignee: Atmel Germany GmbH, Heilbronn (DE)

( * ) Notice: Subject to any disclaimer, the term of this patent is extended or adjusted under 35 U.S.C. 154(b) by 545 days.

(21) Appl. No.: 11/197,442

(22) Filed: Aug. 5, 2005

(65) Prior Publication Data

US 2006/0028901 A1 Feb. 9, 2006

(30) Foreign Application Priority Data

Aug. 6, 2004 (DE) .................. 10 2004 039 619

(51) Int. Cl.
*G06F 17/50* (2006.01)
*G06F 9/455* (2006.01)

(52) U.S. Cl. ........................................... 716/11
(58) Field of Classification Search ............ 716/11
See application file for complete search history.

(56) References Cited

U.S. PATENT DOCUMENTS 4,900,955 A 2/1990 Kurpan

2003/0062931 A1* 4/2003 Carsten ..................... 327/108
2003/0168919 A1 9/2003 Friedrichs et al.
2004/0027755 A1 2/2004 Hajimiri et al.

FOREIGN PATENT DOCUMENTS

| DE | 197 55 134 C1 | 3/1999 |
| DE | 199 26 109-A 1 | 12/2000 |
| EP | 0 660 513 A2 | 6/1995 |
| WO | WO 02/23716 A2 | 3/2002 |

\* cited by examiner

*Primary Examiner*—Jack Chiang
*Assistant Examiner*—Suresh Memula
(74) *Attorney, Agent, or Firm*—Muncy, Geissler, Olds & Lowe, PLLC

(57) ABSTRACT

An integrated circuit layout having a first circuit connection, a second circuit connection, and active components is provided, whereby the active components each have an input connection and an output connection and a predefined maximum reverse voltage between the input connection and the output connection, and whereby a maximum value of a voltage swing, achieved between the first circuit connection and the second circuit connection, is greater than the predefined maximum reverse voltage. The circuit layout is characterized in that an input connection of an n-th active component is connected to an output connection of an (n−1)-th active component, and that the circuit layout changes the potentials of terminal gates of the (n−1)-th component and the n-th component synchronously to a control signal.

6 Claims, 3 Drawing Sheets

CIRCUIT LAYOUT WITH ACTIVE COMPONENTS AND HIGH BREAKDOWN VOLTAGE

This nonprovisional application claims priority under 35 U.S.C. § 119(a) on German Patent Application No. DE 102004039619, which was filed in Germany on Aug. 6, 2004, and which is herein incorporated by reference.

BACKGROUND OF THE INVENTION

1. Field of the Invention

The present invention relates to an integrated circuit layout having a first circuit connection, a second circuit connection, and MOS transistors, whereby the MOS transistors each have a source connection and a drain connection and a predefined maximum reverse voltage between the source connection and the drain connection, and whereby a maximum value of a voltage swing, achieved between the first circuit connection and the second circuit connection, is greater than a predefined maximum reverse voltage. A source connection of an n-th MOS transistor is connected to a drain connection of an (n−1)-th MOS transistor, whereby the circuit layout changes the potentials at the gate terminals of the (n−1)-th MOS transistor and of the n-th MOS transistor substantially synchronously to a control signal.

2. Description of the Background Art

An integrated circuit layout is known from DE 197 55 134 C1 and DE 199 26 109 A1.

MOS transistors are active components, in which variable space charges form. Examples of such components are semiconductor components such as diodes and transistors.

Two advantages can be achieved simultaneously by the series connection of MOS elements. A first advantage is that market segments that require higher reverse voltages, at least in parts, can be served with a single manufacturing process, optimized for a specific reverse voltage. A second advantage results from the fact that the on-resistance R_on of a MOS transistor in general depends quadratically on its reverse voltage. The dependence on the reverse voltage is even more pronounced for the space requirement to achieve a predefined R_on. Lateral MOS components, depending on the desired reverse voltage, are manufactured using different construction principles. For low-blocking logic components, they are made with a drift zone or magnetoresistor and are designated as MOS. For the medium voltage range around 25 V, MOS without a magnetoresistor but with a drift distance are used (MVMOS, MV=medium voltage), and in the voltage range above about 40 V, so-called HVMOS (HV=high voltage) with drift distance and a magnetoresistor are used. The three construction principles have different constants R_on/square of the reverse voltage. The same applies to the space requirement as a function of the reverse voltage. To achieve the same R_on, as a specific HVMOS has, a series connection of, for example, three MVMOS requires, in one respect, a total of 9 times the gate length of a single MVMOS. The width, however, is less than in HVMOS, so that space can be saved in large output drivers.

Further, circuit layouts are known per se, which have passive components with a reactance disposed between active components. Reference is made to WO 02/23716 as an example of this type of known circuit layout. This publication describes a power amplifier with a series connection of a P-MOS transistor (P-MOS=P-Channel Metal Oxide Semiconductor), an inductor, and an N-MOS transistor (N=N-channel). The two complementary MOS transistors are controlled by input signals that are inverses of one another, each conducting or blocking simultaneously. A load is connected to a tap between one of the two MOS transistors and the inductor of the series connection via an LC network of additional inductors and capacitors. This layout is intended to limit voltage peaks, to which the transistors, as connecting elements of the amplifier, are subjected to values below the breakdown voltages of the transistor. High-frequency applications are cited as typical fields of application.

There is the problem in many technical applications that voltages that exceed the breakdown voltages of conventional semiconductor components are to be controlled statically at the circuit output. For such circuits, special semiconductor components have also been used thus far whose breakdown voltage was increased by additional out-diffused and low-doped space-charge regions.

In series connections of MOS transistors with a voltage across the series connection that is greater than the breakdown voltage of a single MOS transistor, there is the problem that the conductivity of the MOS transistors must be controlled synchronously. In a non-synchronous control in which a first MOS transistor enters a low-resistance state before a second MOS transistor, voltage peaks can occur across the second MOS transistor that exceed its breakdown voltage.

SUMMARY OF THE INVENTION

It is therefore an object of the present invention to provide circuit layouts, which distribute a control signal synchronously to the different gate terminals of the MOS transistors in the series connection, so that breakdown voltages of the involved MOS transistors are not exceeded.

In an embodiment according to the invention, the circuit layout has, in addition to the n-th MOS transistor and the (n−1)-th MOS transistor, at least one other MOS transistor, whose source connection occurs at a first supply potential connection, whose drain connection is connected via a first resistor to a second supply potential and via a second resistor to a drain connection of the n-th MOS transistor, whereby a gate terminal of the n-th MOS transistor is connected to a center tap of a voltage divider, which lies between the drain connection of the (n−1)-th MOS transistor and the first supply potential of the circuit layout.

This solution provides a subcircuit connected to the circuit output with line terminals and a gate terminal, in which the potentials at the line terminals and the gate terminal are shifted synchronously through other subcircuits. The subcircuit connected to the circuit output then superimposes another voltage swing on the voltage swing that occurs at its conductivity terminals, so that an increased voltage swing is achieved at the circuit output.

In an alternate embodiment, the circuit layout has a load circuit and a control circuit; the load circuit has a series connection of a first number r of MOS transistors between a first circuit connection and a second circuit connection; the control circuit has a first series connection of the number r of first MOS transistors between a third circuit connection and a fourth circuit connection and a second series connection of the number r of second MOS transistors between a fifth circuit connection and a sixth circuit connection. The first MOS transistors being complementary to the second MOS transistors and the MOS transistors of the load circuit. The control circuit further has a resistor network with a second number s of nodal points, whereby the second number s is greater by one than the first number r; the sixth circuit connection is at a ground potential; the first circuit connection is connected to the third circuit connection; the gate terminal of the last of the second transistors forms a control input of the circuit layout;

the gate terminal of an m-th MOS transistor in the load circuit is connected to the drain connection of the m-th of the first MOS transistors; the gate terminal of the first MOS transistor of the first MOS transistors is connected to the center tap of a resistive voltage divider between the third and the fifth circuit connection. The fourth circuit connection is connected via a resistor to the sixth circuit connection. A first nodal point of the resistor network is connected to the third circuit connection and an s-th nodal point of the resistor network to the sixth circuit connection; one n-th nodal point each of the resistor network is connected to an (n+1)-th nodal point of the resistor network via a resistor; the gate terminal of an m-th of the first MOS transistors, whereby the number m is greater than the number one and less than or equal to the first number r, is connected to the center tap of a resistive voltage divider between a source/drain region, preceding the gate terminal of the m-th of the first transistors, and the m-th nodal point of the resistor network; and the gate terminal of an m-th of the second MOS transistors, whereby the number m is greater than or equal to the number one and less than the first number r, is connected to the center tap of a resistive voltage divider between a source/drain region, following the gate terminal of the m-th of the second transistors, and the (m+1)-th nodal point of the resistor network.

In this case, the term "series connection of a number r of MOS transistors" stands for a series connection of r MOS transistors of a first conductivity type, in which one drain connection each of a MOS transistor is connected to a first circuit connection of the series connection or strictly to a source connection of another of the MOS transistors and one source connection each of one of the MOS transistors to a second circuit connection of the series connection or strictly to a drain connection of another of the MOS transistors. A "source/drain region" in this case designates a source or a drain region of a MOS transistor. The series connection of a number of N-MOS transistors (P-MOS transistors) provides an arrangement of transistors, such that the drain connection (source connection) of the "first" transistor lies at the circuit connection with the lower ordinal number and the drain connection (source connection) of a "next" transistor is connected to the source connection (drain connection) of a pre-defined MOS transistor. In reference to a gate terminal of an n-th MOS transistor of a series connection, the "following (preceding) source/drain region" is taken to mean the source connection (drain connection) of the n-th MOS transistor.

By means of this solution, a change in the control signal at the control input of the circuit layout is distributed parallel to the gate terminals of the transistors of the rest of the circuit layout. As a consequence of this distribution, changes in the conductivity of these transistors occur in a coordinated manner so that the breakdown voltages of the individual transistor are not exceeded. This embodiment with resistive voltage dividers when the circuit layout is in the off state as well provides for defined potentials at the gate terminals, which arise as a result of a quiescent current via the resistors lying between the first circuit connection and the sixth circuit connection.

In yet another embodiment, the circuit layout has a load circuit and a control circuit; the load circuit has a series connection of a first number r of MOS transistors between a first circuit connection and a second circuit connection; the control circuit has a first series connection of the number r of first MOS transistors between a third circuit connection and a fourth circuit connection and a second series connection of the number r of second MOS transistors between a fifth circuit connection and a sixth circuit connection, the first MOS transistors being complementary to the second MOS transistors and the MOS transistors of the load circuit; the sixth circuit connection is at a ground potential; the first circuit connection is connected to the third circuit connection; the gate terminal of the last of the second transistors forms a control input of the circuit layout; the gate terminal of an m-th MOS transistor in the load circuit is connected to the drain connection of the m-th of the first MOS transistors; the gate terminal of the first of the first MOS transistors is connected to the center tap of a resistive voltage divider between the third and the fifth circuit connection; the fourth circuit connection is connected via a resistor to the sixth circuit connection; the gate terminal of an m-th of the first MOS transistors, whereby the number m is greater than the number one and less than or equal to the first number r, is connected to the center tap of a capacitive voltage divider formed of capacitors between a source/drain region, preceding the gate terminal of the m-th of the first transistor, and the gate terminal of the (m−1)-th of the second transistors; and the gate terminal of an m-th of the second MOS transistors, whereby the number m is greater than or equal to the number one and less than the first number r, is connected to the center tap of a capacitive voltage divider formed of capacitors between a source/drain region, following the gate terminal of the m-th of the second transistors, and the gate terminal of the (m+1)-th of the first transistors.

This control circuit as well distributes a change in the control signal at the control input of the circuit layout parallel to the gate terminals of the transistors of the rest of the circuit layout, so that here as well changes in the conductivity of these transistors occur in a coordinated manner such that the breakdown voltages of the individual transistor are not exceeded. A further advantage, resulting from the use of capacitors for coupling the series connections, is that a currentless control of the circuit layout is possible. Because no quiescent current is necessary, this embodiment is particularly suitable for applications in which minimal current consumption is required.

One embodiment provides that a portion of the capacitors is realized by parasitic capacitors of the MOS transistors.

This embodiment makes it possible to reduce the number of separate capacitors and thereby to reduce the circuit's space requirement.

It is preferred within the scope of other embodiments that pn junctions of different components in different regions, separated from each other by insulation structures, of a semiconductor substrate have different potentials.

By means of this embodiment, to a certain extent, a single pn junction is replaced by a plurality of pn junctions lying one behind the other, which are separated by insulation structures and have different potentials. This embodiment results in an immense broadening of the applications of integrated circuits as a result of the possible multiplication of the output voltage control region.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
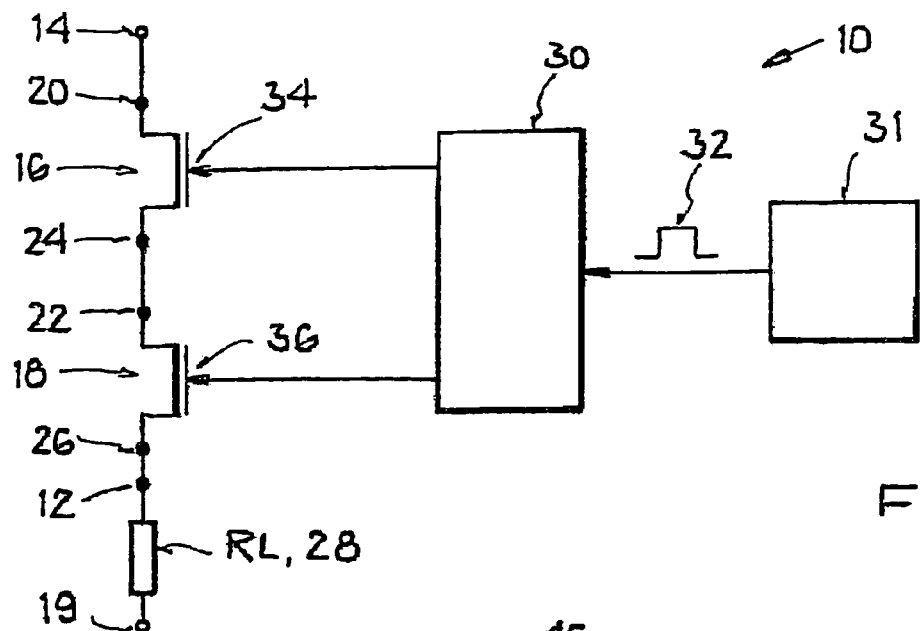
FIG. 1 is a series connection of MOS transistors.

FIG. 1 shows a circuit layout 10 having a first circuit connection 12, a second circuit connection 14, and active components 16, 18, whereby the active components 16, 18 each have an input connection 20, 22, an output connection 24, 26, and a predefined maximum reverse voltage between input connection 20, 22 and output connection 24, 26. The active components 16, 18 can be, for example, self-blocking (normal off, enhancement type) HVN-MOS transistors with a maximum reverse voltage of 65 V. They are connected in series, so that an input connection 22 of an n-th active component 18 is connected to an output connection 24 of an (n−1)-th active component 16. Between the first circuit connection 12 and a ground potential connection 19, there is a load 28, which is shown in FIG. 1 as representative for all embodiments of electrical loads as the load resistance RL.

By means of the series connection of the active components 16, 18, only part of the entire voltage between the circuit connections 12, 14 declines across each of the active components 16, 18. The maximum value of a voltage permissible between the first circuit connection 12 and the second circuit connection 14 is therefore greater than a predefined maximum reverse voltage of an individual active component 16 or 18. Accordingly, a control circuit 30, which belongs to circuit layout 10 and is controlled by a control signal transmitter 31, can set a voltage swing between the first circuit connection 12 and the second circuit connection 14 of the circuit layout 10, which exceeds the value of the maximum reverse voltage of an individual active component 16 or 18, by changes in potentials, occurring synchronously to a control signal 32, at gate terminals 34, 36 of the active components 16, 18.

In this case, the signals transmitted to the gate terminals 34, 36 can be unidirectional. However, they can also be inverse to one another to control synchronously complementary (N-MOS, P-MOS) transistors in a series connection.

In the example in FIG. 1, the potential at the second circuit connection 14, for example, can be 100 V more positive than the ground potential at the ground potential connection 19. In such a "low-side" layout of the load 28, in nonconducting controlled active components 16, 18, therefore, if no current flows through the circuit layout 10, the potential of the ground potential connection 19 occurs at the first circuit connection 12, so that a voltage of 100 V decreases across the series connection of the active components 16, 18. In similar active components 16, 18, a voltage of 50 V then decreases across each individual active component 16, 18, so that the permissible reverse voltage of 65 V is not exceeded.

In comparison with a single transistor, thereby, in the construction of the circuit layout 10 from semiconductor components, a single, temporarily blocked pn junction is replaced by a plurality of pn junctions connected in series. In this case, the regions of the semiconductor substrate, in which the pn junctions connected in series are located, must be insulated from one another. In this case, regions are understood to be insulated from one another, when they have substantially different potentials, without a useable current flowing between them. This type of insulation occurs at the outset in a realization of the series connection of discrete active components 16, 18. The appropriate regions of the semiconductor substrate, in contrast, must be insulated from each other in a realization in the form of an integrated circuit. This insulation can occur, for example, by suitable high-blocking pn junctions or also in a dielectric manner.

Figure 2:
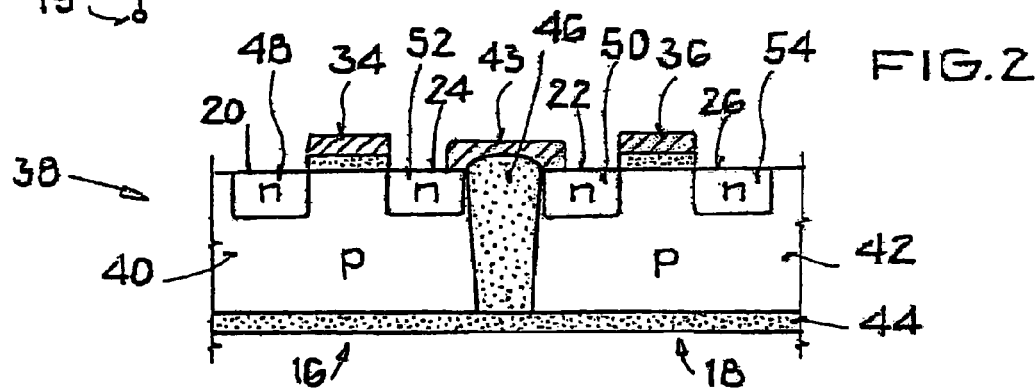
FIG. 2 is a cross section through a series connection of FIG. 1 in a realization as an integrated circuit.

FIG. 2 shows a detail 38 from an integrated circuit with a series connection of active components 16 and 18 in the form of N-MOS transistors. Different regions 40, 42 of a p-conducting substrate, which extends to an insulating layer 44 (SOI structure, SOI=semiconductor on insulator), are insulated from each other with an insulating groove structure 46 filled with a dielectric. n-Doped regions 48, 50 form drain regions, whereas n-doped regions 52, 54 act as source regions. The boundaries between the n-doped regions 48, 50, 52, 54 and the p-doped regions 40, 42 represent pn junctions in the nonconducting state.

With the exemplary values given above, the pn junctions in the blocked state in the left part of detail 38 of the circuit are between 100 V at the input connection 20 and 50 V at the output connection 24, whereas in the right part they are between 50 V at the input connection 22 and 0 V at the output connection 26. The connections 20, 22, 24, 26, 34, 36 have already been explained in relation to FIG. 1. Both active components (N-MOS transistors) 16, 18 are connected in series via a conducting junction 43 of the connections 22 and 24. By regulation of the gate terminals 34, 36 with a potential, positive in comparison with the source regions 52, 54, n-conducting channels are created between the n-doped region 48 (drain) and 52 (source) and 50 (drain) and 54 (source) to control the series connection conductively. In conjunction with FIG. 1, FIG. 2 thereby shows a circuit layout realized as an integrated circuit, in which pn junctions of different active components 16, 18 in different regions 40, 42, separated from each other by insulation structures 46, of a p-conducting semiconductor substrate have different potentials. Furthermore, FIG. 1 in regard to FIG. 2 shows a circuit layout 10 with MOS transistors as active components 16, 18, whereby input connections 20, 22 of the active components 16, 18 are formed by drain connections of the MOS transistors and output connections 24 of the active components by source connections of the MOS transistors.

Figure 3:
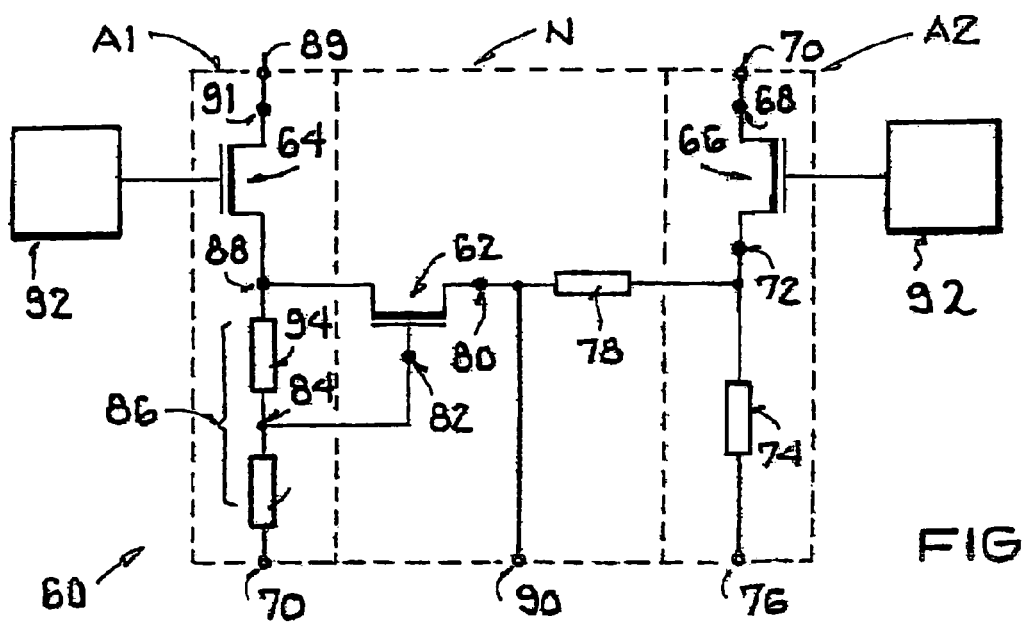
FIG. 3 is a first exemplary embodiment of the invention.

FIG. 3 shows an embodiment of a circuit layout 60, which, in addition to an n-th MOS transistor 62 and an (n−1)-th MOS transistor 64, has an additional MOS transistor 66, whose source connection 68 occurs at a first supply potential of, e.g., 50 V at a connection 70, whose drain connection 72 is connected via a first resistor 74 to a second supply potential of, for example, 100 V at a connection 76 and via a second resistor 78 to a drain connection 80 of the n-th MOS transistor 62, whereby a gate terminal 82 of the n-th MOS transistor 62 is connected to a center tap 84 of a voltage divider 86, which lies between a source/drain region 88 as a drain connection of the (n−1)-th MOS transistor 64 and the first supply potential (connection 70) of the circuit layout 60. A resistor 94 is located here as a partial resistor of the voltage divider 86 between the source/drain region 88 and the center tap 84 of the voltage divider 86. A source connection 91 of the (n−1)-th MOS transistor 64 is connected to a connection 89 of circuit 60. There is a ground potential of, for example, 0 V at connection 89.

Using the circuit layout 60, an output voltage is set at connection 90, whereby the setting occurs with use of a control circuit 92. The (n−1)-th MOS transistor 64 and the additional MOS transistor 66 are controlled synchronously by the control circuit 92, whereby a digital ON/OFF control is assumed for the sake of simplicity for further explanation. It is understood, however, that between the resulting minimum and maximum values, which define the voltage swing at connection 90, all values between the extreme values can also be set. This applies in other respects to the embodiments described further below according to FIGS. 4 and 5.

With the given exemplary values, if the (n−1)-th MOS transistor 64 and the additional MOS transistor 66 block, the same potential of 50 V results at the source/drain region 88 and the center tap 84, so that the (self-blocking) n-th MOS transistor 62 blocks because of the absence of a potential difference between gate terminal 82 and source/drain region 88. As a result, the potential punches through from connection 76 to connection 90, so that 100 V occurs there. In this state, the series connection from n-th MOS transistor 62 and (n−1)-th MOS transistor 64 must block accordingly a voltage of 100 V to connection 89.

If the MOS transistors 64 and 66, on the contrary, are turned on synchronously by the control circuit 92, currents flow across the voltage divider 86 and across the first resistor 74. The voltages at the source/drain region 88 and the center tap 84 decline, whereby the resistor 94 located between them reduces the voltage at the source/drain region 88 more greatly. As a result, a positive voltage results between the gate terminal 82 and the source/drain region 88, so that the n-th MOS transistor 62 conducts. Because of the current across the first resistor 74, the potential at the remaining drain connection 80 of the n-th MOS transistor 62 also declines, so that the subcircuits A1 and A2 synchronously shift the potentials at the drain connection 72, the source/drain region 88, and the gate terminal 82. Drain connection 72, source/drain region 88, and gate terminal 82 form the connections of a subcircuit N to subcircuits A1 and A2. The subcircuits A1 and A2 thereby shift potentials at connections of the subcircuit N and thereby at connections of the n-th MOS transistor 62 synchronously to one another. With appropriate dimensioning of the resistors, with conducting transistors 64 and 66 a potential of 10V results at connection 90 and thereby a switchable or controllable voltage swing of 90 V. The circuit 60 thereby causes the voltage swing of the transistor 64 to superimpose the changes in voltages at the source/drain region 88 and the drain connection 80 of the n-th transistor 62, which are on the order of about 50 V. In this regard, the potentials at the source/drain region 88, at the gate terminal 82, and at the drain connection 80 are shifted synchronously so that the maximum reverse voltage of, for example, 65 V is not exceeded.

Figure 4:
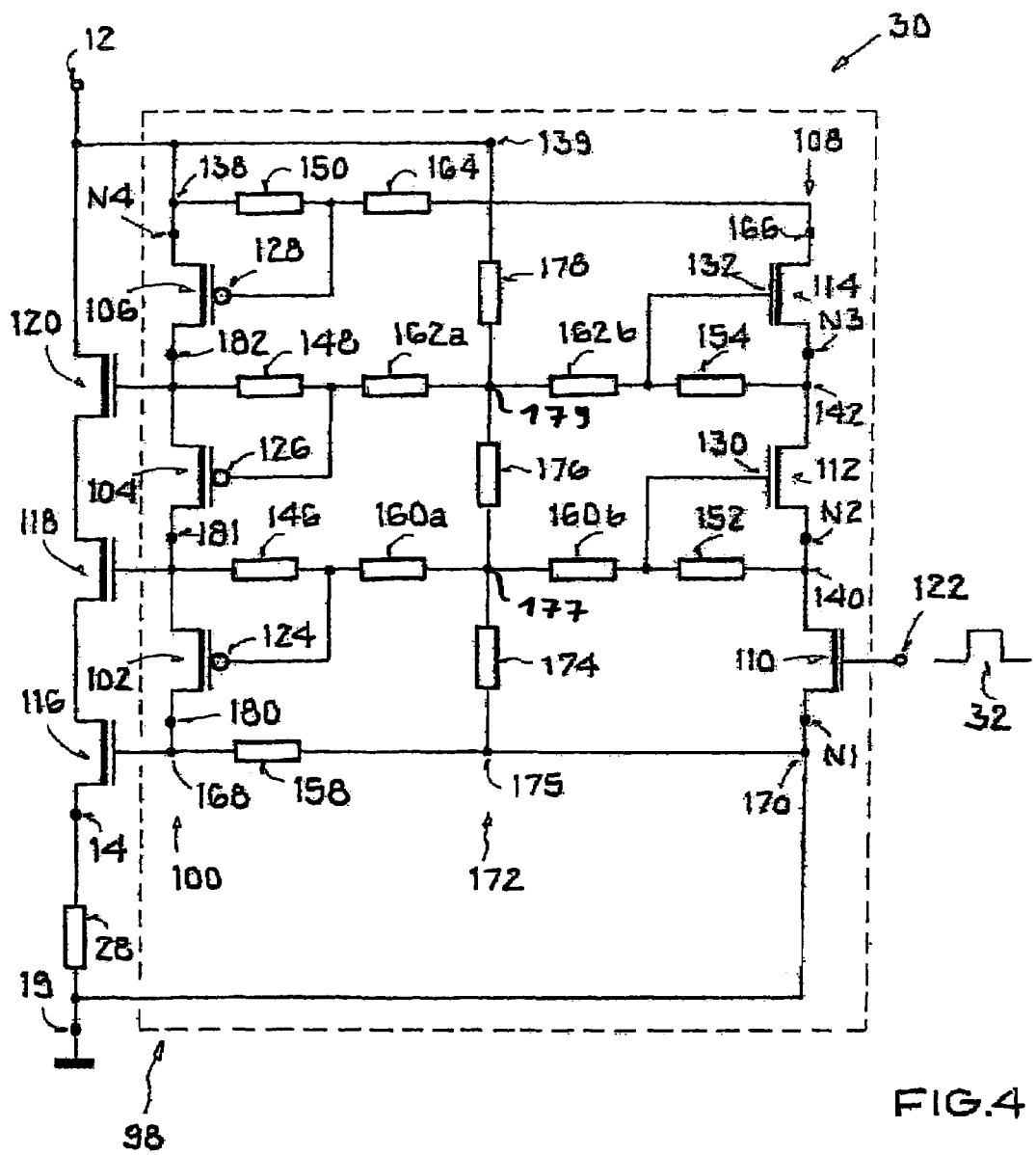
FIG. 4 is another exemplary embodiment of the invention.

FIG. 4 shows a circuit layout 98 with a load circuit and a control circuit 30. The load circuit has a series connection of a first number r=3 of MOS transistors 120, 118, 116 between a first circuit connection 12 and a second circuit connection 14, as well as a load 28. The control circuit 30 has a first series connection 100 of the number r of first MOS transistors 106, 104, 102 between a third circuit connection 138 and a fourth circuit connection 168 and a second series connection 108 of the number r of second MOS transistors 114, 112, 110 between a fifth circuit connection 166 and a sixth circuit connection 170. In this case, the first MOS transistors 106, 104, 102 are complementary to the second MOS transistors 114, 112, 110 and the MOS transistors 120, 118, 116 of the load circuit. In P-MOS transistors (N-MOS transistors), the second transistors act as the first transistor and the transistors of the load circuit therefore as N-MOS transistors (PMOS transistors). The control circuit 30 further has a resistor network with a second number s of nodal points 139, 179, 177, 175, whereby the second number s is greater by one than the first number r. The sixth circuit connection 170 is at a ground potential. The first circuit connection 12 is connected to the third circuit connection 138. A gate terminal 122 of the last 110 of the second transistors 114, 112, 110 forms a control input of the circuit layout 98.

A gate terminal of an m-th of the MOS transistors 120, 118, 116 in the load circuit is connected to a source/drain region 180, 181, 182 (drain connection) of the m-th of the first MOS transistors 106, 104, 102. A gate terminal 128 of the first MOS transistor 106 of the first MOS transistors 106, 104, 102 is connected to the center tap of a resistive voltage divider between the third 138 and the fifth circuit connection 166. The resistive voltage divider includes resistors 150, 164. The fourth circuit connection 168 is connected via a resistor 158 to the sixth circuit connection 170. The first nodal point 139 of the resistor network is connected to the third circuit connection 138, and the s-th nodal point 175 of the resistor network to the sixth circuit connection 170. The n-th nodal point 139, 179, 177 of the resistor network is connected in each case to the (n+1)-th nodal point 179, 177, 175 of the resistor network via a resistor 178, 176, 174. A gate terminal 126, 124 of an m-th of the first MOS transistors 104, 102, whereby the number m is greater than the number one and less than or equal to the first number r, is connected to the center tap of a resistive voltage divider formed of resistors 148, 162a or 146, 160a between a source/drain region 182, 181, preceding the gate terminal of the m-th of the first MOS transistors 104, 102, and the m-th nodal point 179, 177 of the resistor network. The source/drain region 182, 181 forms a source connection of the MOS transistor 104, 102. A gate terminal 132, 130 of an m-th of the second MOS transistors 114, 112, whereby the number m is greater than or equal to the number one and less than the first number r, is connected to the center tap of a resistive voltage divider formed of resistors 162b, 154 or 160b, 152 between a source/drain region 142, 140, following the gate terminal 132, 130 of the m-th of the second transistors 114, 112, and the (m+1)-th nodal point 179, 177 of the resistor network. The source/drain region 142, 140 forms a drain connection of the MOS transistor 112, 110 and is connected to source/drain regions N3, N2 acting as source connections of the MOS transistors 114, 112.

Connections of source/drain regions 180, 181, 182 of the first MOS transistors 102, 104, 106, which serve as drain connections there, to source/drain regions N1, N2, N3 of the second MOS transistors 110, 112, 114, which serve as source connections there, in a first operating state of the circuit 98, in which the MOS transistors 102, 104, 106, 110, 112, 114, 116, 118, 120 are blocked, are set to defined potentials by a voltage divider 172 of the ohmic resistors 174, 176, 178. In the first operating state, about a third of the voltage, which, for example, can be 150 V, between the circuit connections 12 and 14 decreases particularly across each of the MOS transistors 102, 104, 106 and 116, 118, 120.

A positive input signal 32 controls the MOS transistor 110 conductively. As a result, another current path across the resistors 160b, 152 and the MOS transistor 110 arises in addition to a quiescent current path across the voltage divider 172. As a result, the potential at source/drain region N2 of the MOS transistor 112 declines. The current flow across resistor 152 produces a potential difference between source/drain region N2 and gate terminal 130 of the MOS transistor 112, which also controls these conductively. The MOS transistor 114 is controlled conductively in an analogous manner. The current flow across the MOS transistor 114 creates a voltage drop from a source/drain region N4, serving as a source connection of the MOS transistor 106, to the gate terminal 128 of this MOS transistor, which controls the MOS transistor 106 in the conducting state. The MOS transistors 104 and 102 in the conducting state are controlled in an analogous manner.

As a result of the conducting MOS transistors 102, 104, 106, the high potential punches through from circuit connection 14 to the gate terminals of the MOS transistors 116, 118 120, so that these also conduct. As a result, with the given exemplary value of 150 V at the circuit connection 12, a voltage swing of 0 to about 150 V arises, whereby each of the transistors 116, 118, 120 must block only about 50 V.

In a specific embodiment, the following voltages in volts result at individual points of the circuit in the on state and in the off state:

| Connection | State: off | State: on |
|---|---|---|
| 12, 138, 139 | 150 | 150 |
| 179 | 100 | 100 |
| 177 | 50 | 50 |
| 19, 170, 175 | 0 | 0 |
| 122 | 0 | 5 |
| 140 | 50 | 1 |
| 130 | 50 | 6 |
| 142 | 100 | 2 |
| 132 | 100 | 7 |
| 166 | 150 | 3 |
| 128 | 150 | 144 |
| 136 | 100 | 149 |
| 126 | 100 | 143 |
| 134 | 50 | 148 |
| 124 | 50 | 142 |
| 168 | 0 | 147 |
| 14 | 0 | 146 |

In this specific embodiment with the load 28 at the ground potential connection 19 (low side), therefore for a voltage swing of 150 V at the second circuit connection 14 at the gate terminal 124 of transistor 102 in the load circuit, a voltage of 150 V without load must be connected. This is made possible by control circuit 30.

Figure 5:
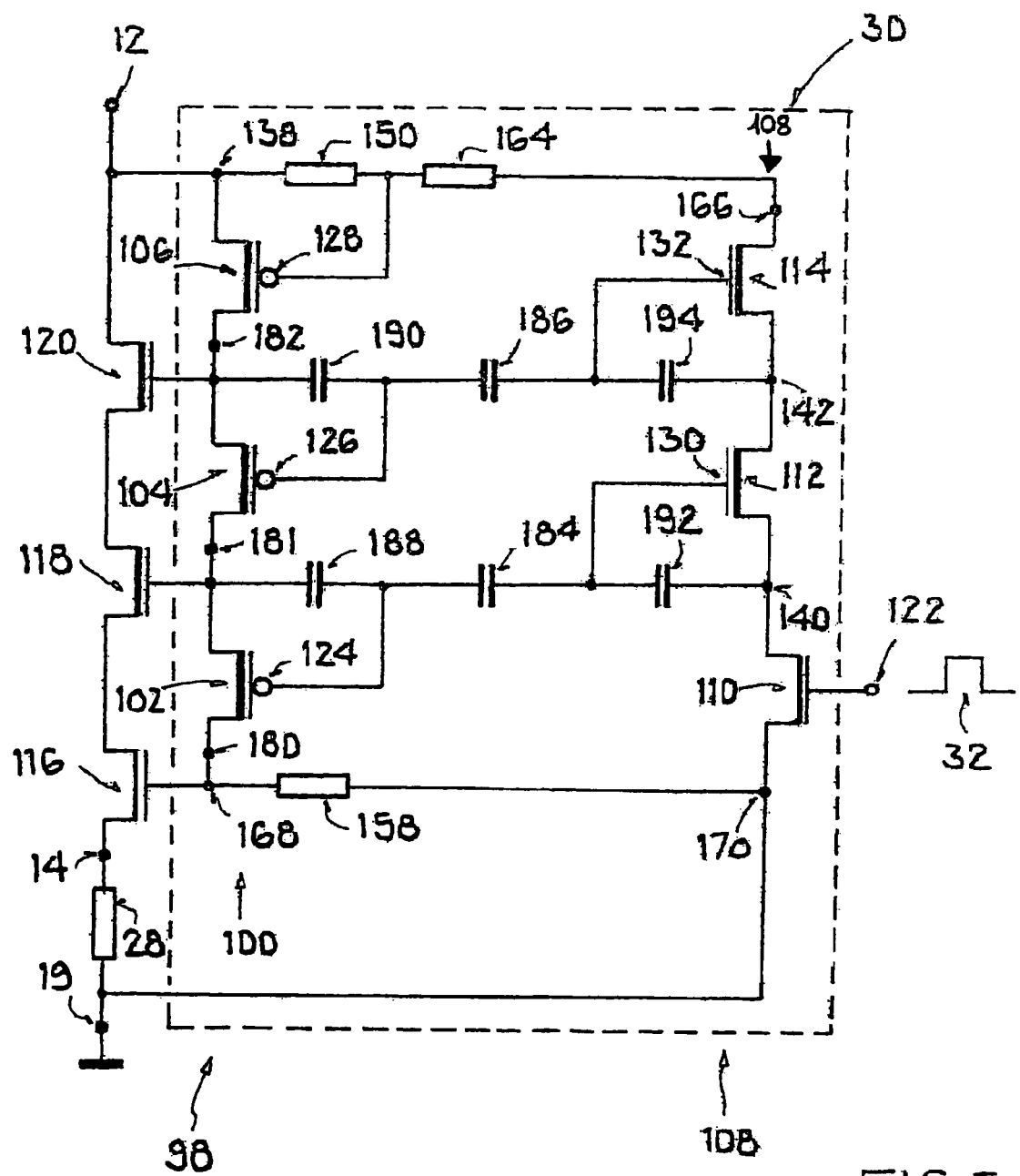
FIG. 5 is another exemplary embodiment of the invention.

FIG. 5 also shows a circuit layout 98 with a load circuit and a control circuit 30. The load circuit has a series connection of r=3 of MOS transistors 120, 118, 116 between a first circuit connection 12 and a second circuit connection 14, as well as a load 28 between the second circuit connection 14 and a ground potential connection 19. The control circuit 30 has a first series connection 100 of the number r of first MOS transistors 106, 104, 102 between a third circuit connection 138 and a fourth circuit connection 168 and a second series connection 108 of the number r of second MOS transistors 114, 112, 110 between a fifth circuit connection 166 and a sixth circuit connection 170. The first MOS transistors 106, 104, 102 here as well are complementary to the second MOS transistors 114, 112, 110 and the MOS transistors 120, 118, 116 of the load circuit. The sixth circuit connection 170 is at ground potential and the first circuit connection 12 is connected to the third circuit connection 138. The gate terminal 122 of the last 110 of the second transistors 114, 112, 110 forms a control input of the circuit layout 98. In other respects, the same reference characters in FIGS. 4 and 5 describe the same items.

A gate terminal of an m-th of the MOS transistors 120, 118, 116 in the load circuit is connected to a source/drain region 182, 181, 180 (drain connection) of the m-th of the first MOS transistors 106, 104, 102. A gate terminal 128 of the first 106 of the first MOS transistors 106, 104, 102 is connected to the center tap of a resistive voltage divider formed of resistors 150, 164 between the third 138 and the fifth circuit connection 166. The fourth circuit connection 168 is connected via a resistor 158 to the sixth circuit connection 170. The gate terminal 126, 124 of an m-th of the first MOS transistors 104, 102, whereby the number m is greater than the number one and less than or equal to the first number r, is connected to the center tap of a capacitive voltage divider formed of capacitors 190, 186, 188, 184 between a source/drain region 182, 181, preceding the gate terminal 126, 124 of the m-th of the first transistors 104, 102, and the gate terminal 132, 130 of the (m−1)-th of the second transistors 114, 112. The source/drain region 182, 181 forms a source connection of the MOS transistor 104, 102.

A gate terminal 132, 130 of an m-th of the second MOS transistors 114, 112, whereby the number m is greater than or equal to the number one and less than the first number r, is connected to the center tap of a capacitive voltage divider formed of capacitors 186, 194; 184, 192 between a source/drain region 142, 140, following the gate terminal 132, 130 of the m-th of the second transistors 114, 112, and the gate terminal 126, 124 of the (m+1)-th of the first transistors 104, 102. The source/drain region 142, 140 forms a drain connection of the MOS transistor 112, 110 and is connected to source/drain regions N3, N2 acting as source connections of the MOS transistors 114, 112.

Because the resistive voltage divider 172 of FIG. 4 provides a current path for a quiescent current, the subject of FIG. 4 also consumes a certain amount of current in the quiescent state. For applications in which this type of current consumption is undesirable, for example, in mobile applications, the embodiment according to FIG. 5 is more suitable instead of the embodiment according to FIG. 4. The subject of FIG. 5 represents an embodiment, which does not use the resistive voltage divider but capacitive voltage dividers in its place.

In this regard, the capacitors 188, 190, 192, 194 can be realized as parasitic capacitors of MOS transistors.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit layout comprising:
   a first circuit connection;
   a second circuit connection;
   a first and second transistor, the first and second transistors each having a source connection and a drain connection and a predefined maximum reverse voltage between the source connection and the drain connection, a maximum value of a voltage swing, achieved between the first circuit connection and the second circuit connection is greater than the predefined maximum reverse voltage, the source connection of the first transistor is connected to a drain connection of the second transistor, the integrated circuit layout changing potentials at gate terminals of the second transistor and the first transistor substantially synchronously based on a control signal; and
   a third transistor having a source connection located at a first supply potential connection, a drain connection connected via a first resistor to a second supply potential and via a second resistor to a drain connection of the first transistor,
   wherein a gate terminal of the first transistor is connected to a center tap of a voltage divider, which lies between the drain connection of the second transistor and the first supply potential.

2. The circuit layout according to claim 1, wherein pn junctions of different MOS transistors in different regions, separated from one another by insulation structures of a semiconductor substrate have different potentials.

3. The integrated circuit layout according to claim 1, wherein the first transistor is a n-th, MOS transistor, and wherein the second transistor is a (n−1)-th MOS transistor.

4. An integrated circuit layout comprising:
a first circuit connection;
a second circuit connection; and
MOS transistors, the MOS transistors each having a source connection and a drain connection and a predefined maximum reverse voltage between the source connection and the drain connection, and whereby a maximum value of a voltage swing, achieved between the first circuit connection and the second circuit connection, is greater than the predefined maximum reverse voltage, a source connection of an n-th MOS transistor is connected to a drain connection of an (n−1)-th MOS transistor, and the circuit layout changes the potentials at the gate terminals of the (n−1)-th MOS transistor and of the n-th MOS transistor substantially synchronously based on a control signal;
a load circuit and a control circuit, the load circuit having a series connection of a first number r of MOS transistors between the first circuit connection and the second circuit connection, the control circuit has a first series connection of the number r of first MOS transistors between a third circuit connection and a fourth circuit connection and a second series connection of the number r of second MOS transistors between a fifth circuit connection and a sixth circuit connection, the first MOS transistors being complementary to the second MOS transistors and the MOS transistors of the load circuit, the control circuit further including a resistor network with a second number s of nodal points, whereby the second number s is greater by one than the first number r, the sixth circuit connection is at a ground potential, the first circuit connection is connected to the third circuit connection; a gate terminal of the last of the second transistors forms a control input of the circuit layout, a gate terminal of an m-th MOS transistor in the load circuit is connected to a source/drain region of an m-th of the first MOS transistors, a gate terminal of a first MOS transistor of the first MOS transistors is connected to a center tap of a resistive voltage divider between the third and the fifth circuit connection, the fourth circuit connection is connected via a resistor to the sixth circuit connection, a first nodal point of the resistor network is connected to the third circuit connection and an s-th nodal point of the resistor network to the sixth circuit connection, one n-th nodal point each of the resistor network is connected to an (n+1)-th nodal point of the resistor network via a resistor, a gate terminal of an m-th of the first MOS transistors, whereby the number m is greater than the number one and less than or equal to the first number r, is connected to the center tap of a resistive voltage divider between a source/drain region preceding the gate terminal of the m-th of the first transistors, and the m-th nodal point of the resistor network; and
a gate terminal of an m-th of the second MOS transistors, whereby the number m is greater than or equal to the number one and less than the first number r, is connected to the center tap of a resistive voltage divider between a source/drain region following the gate terminal of the m-th of the second transistors and the (m+1)-th nodal point (179, 177) of the resistor network.

5. An integrated circuit layout comprising:
a first circuit connection;
a second circuit connection;
MOS transistors, the MOS transistors each having a source connection and a drain connection and a predefined maximum reverse voltage between the source connection and the drain connection, a maximum value of a voltage swing achieved between the first circuit connection and the second circuit connection is greater than the predefined maximum reverse voltage, a source connection of an n-th MOS transistor is connected to a drain connection of an (n−1)-th MOS transistor, and the integrated circuit layout changes the potentials at the gate terminals of the (n−1)-th MOS transistor and of the n-th MOS transistor substantially synchronously based on a control signal;
a load circuit and a control circuit, the load circuit having a series connection of a first number r of MOS transistors between a first circuit connection and a second circuit connection, the control circuit having a first series connection of the number r of first MOS transistors between a third circuit connection and a fourth circuit connection, and a second series connection of the number r of second MOS transistors between a fifth circuit connection and a sixth circuit connection, the first MOS transistors being complementary to the second MOS transistors and the MOS transistors of the load circuit, the sixth circuit connection being at a ground potential, the first circuit connection being connected to the third circuit connection;
a gate terminal of the last second transistor of the second MOS transistors forming a control input of the circuit layout;
a gate terminal of an m-th MOS transistor in the load circuit being connected to a source/drain region of an m-th of the first MOS transistors;
a gate terminal of a first MOS transistor of the first MOS transistors being connected to a center tap of a resistive voltage divider between the third and the fifth circuit connection, the fourth circuit connection being connected via a resistor to the sixth circuit connection;
a gate terminal of an m-th of the first MOS transistors, the number m being greater than the number one and less than or equal to the first number r, is connected to a center tap of a capacitive voltage divider formed of capacitors between a source/drain region, preceding the gate terminal of the m-th of the first transistors, and a gate terminal of an (m−1)-th of the second transistors; and
a gate terminal of the m-th of the second MOS transistors, the number m being greater than or equal to the number one and less than the first number r, is connected to a center tap of a capacitive voltage divider formed of capacitors between a source/drain region following the gate terminal of the m-th of the second transistors, and the gate terminal of the (m+1)-th of the first transistors.

6. The integrated circuit layout according to claim 5, wherein a portion of the capacitors is formed by parasitic capacitors of the MOS transistors.

* * * * *